United States Patent
Ali et al.

(10) Patent No.: US 12,482,741 B2
(45) Date of Patent: Nov. 25, 2025

(54) STAGGERED SHIELD WIRES EXTENDING ALONG SUBSECTIONS OF SIGNAL WIRES

(71) Applicant: Avago Technologies International Sales Pte. Limited, Singapore (SG)

(72) Inventors: Mohamed Anwar Ali, San Jose, CA (US); James Robert Church, West Linn, OR (US); Sudersan Sampath, Santa Clara, CA (US); Roger A. Fratti, Mohnton, PA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 571 days.

(21) Appl. No.: 17/588,504

(22) Filed: Jan. 31, 2022

(65) Prior Publication Data

US 2023/0245973 A1 Aug. 3, 2023

(51) Int. Cl.
| | |
|---|---|
| *H01L 23/522* | (2006.01) |
| *H01L 21/48* | (2006.01) |
| *H01L 23/498* | (2006.01) |
| *H01L 23/528* | (2006.01) |
| *H01L 23/538* | (2006.01) |
| *H01L 23/552* | (2006.01) |
| *H01L 25/065* | (2023.01) |
| *H01L 25/18* | (2023.01) |

(52) U.S. Cl.
CPC ...... *H01L 23/5225* (2013.01); *H01L 21/4857* (2013.01); *H01L 23/49811* (2013.01); *H01L 23/49844* (2013.01); *H01L 23/5227* (2013.01); *H01L 23/528* (2013.01); *H01L 23/5386* (2013.01); *H01L 23/552* (2013.01); *H01L 25/0652* (2013.01); *H01L 25/18* (2013.01)

(58) Field of Classification Search
CPC .............. H01L 23/552; H01L 23/5386; H01L 21/4857; H01L 24/16; H01L 25/0652; H01L 25/18; H01L 2224/16225; H01L 23/49816; H01L 23/5383; H01L 23/49844; H01L 23/528; H01L 23/49811
See application file for complete search history.

(56) References Cited

U.S. PATENT DOCUMENTS

| | | | |
|---|---|---|---|
| 10,950,277 B1 * | 3/2021 | Nobehara | G11C 8/14 |
| 2001/0048163 A1 * | 12/2001 | Kohno | H01L 23/5225 |
| | | | 257/E23.114 |
| 2023/0075833 A1 * | 3/2023 | Choi | H01L 23/552 |

FOREIGN PATENT DOCUMENTS

JP 2011222854 A * 11/2011

* cited by examiner

*Primary Examiner* — Ratisha Mehta
*Assistant Examiner* — Brad A Knudson
(74) *Attorney, Agent, or Firm* — Foley & Lardner LLP

(57) ABSTRACT

An electrical device for transporting electrical signals, wherein the electrical device comprises a plurality of signal wires each configured for transporting electrical signals, and a plurality of shield wires being staggered with respect to each other and each being configured for shielding signal wires with respect to each other, wherein each shield wire is arranged between a respective pair of signal wires and extends only along a subsection of each signal wire of the respective pair.

30 Claims, 3 Drawing Sheets

STAGGERED SHIELD WIRES EXTENDING ALONG SUBSECTIONS OF SIGNAL WIRES

FIELD OF THE DISCLOSURE

This disclosure generally relates to an electrical device for transporting electrical signals. Furthermore, this disclosure relates to a method of manufacturing an electrical device for transporting electrical signals.

BACKGROUND OF THE DISCLOSURE

When manufacturing electrical devices, it may be possible to provide shield wires between signal wires to isolate coupling effects. When signals, in particular digital signals, switch between different values (different logical values in the case of digital signals), electric noise is generated upon switching. Since any signal wire can behave as both a crosstalk aggressor (i.e. a wire creating noise) and victim (i.e. a wire suffering from noise), multiple shields can be inserted. IC (integrated circuit) routing of multiple high-speed electrical signals may create both capacitive and inductive crosstalk effects between these signal wires. This undesired phenomenon may occur when an aggressor signal wire couples to victim wires with signals travelling in the same or opposite directions. These coupling effects can cause loss of signal integrity of the transmitted signal.

BRIEF DESCRIPTION OF THE DRAWINGS

Various objects, aspects, features, and advantages of the disclosure will become more apparent and better understood by referring to the detailed description taken in conjunction with the accompanying drawings. In the drawings, like reference numbers generally indicate identical, functionally similar, and/or structurally similar elements.

Figure 1:
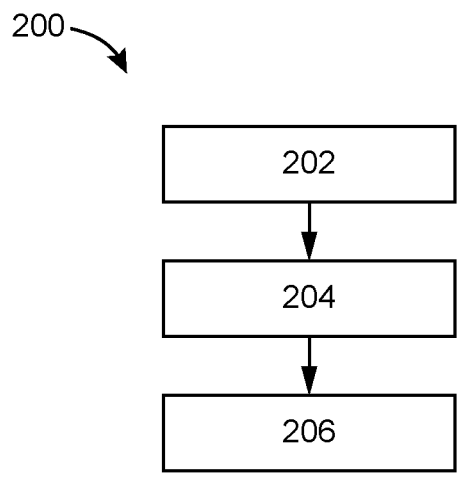
FIG. 1 is a flow diagram of a method of manufacturing an electrical device for transporting electrical signals according to an embodiment.

The details of various embodiments of the methods and systems are set forth in the accompanying drawings and the description below.

DETAILED DESCRIPTION

Below are detailed descriptions of various concepts related to, and embodiments of, techniques, approaches, methods, apparatuses, and systems for transporting electrical signals. The various concepts introduced above and discussed in detail below can be implemented in any of numerous ways, as the described concepts are not limited to any particular manner of implementation. Examples of specific embodiments and applications are provided primarily for illustrative purposes.

In an embodiment, an electrical device for transporting electrical signals is provided, wherein the electrical device includes a number of signal wires each configured for transporting electrical signals. Furthermore, the electrical device comprises a number of shield wires being staggered with respect to each other and each being configured for shielding signal wires with respect to each other. Each shield wire may be arranged between a respective pair of signal wires and may extend only along a subsection of each signal wire of the respective pair.

In another embodiment, a method of manufacturing an electrical device for transporting electrical signals is provided, wherein the method comprises configuring a plurality of signal wires for transporting electrical signals. Furthermore, the method may comprise staggering a plurality of shield wires with respect to each other for shielding the signal wires with respect to each other. Beyond this, the method may comprise arranging each shield wire between a respective pair of signal wires so that each shield wire extends only along a subsection of each signal wire of the respective pair.

In the context of the present application, the term "electrical device" may denote for example any device comprising circuitry with signal wires along which signals propagate. The electrical device may be or may comprise an integrated circuit such as a semiconductor chip, or may be an arrangement of a plurality of modules, sub-devices and/or electronic components. For example, such an electrical device may comprise a member, portion or circuitry along which signals are transported between different electronic entities of the electrical device, for example between different semiconductor chips. For instance, the signal wires and the shield wires may be integrated in an interposer connecting such different electronic entities. In another embodiment, the signal wires and the shield wires may be arranged in an interior of one semiconductor chip and the signal wires may be configured for transporting electrical signals between different regions of the semiconductor chip. In the latter mentioned embodiment, the shield wires may shield different signal wires in an interior of the semiconductor chip.

In the context of the present application, the term "electrical signals" may denote for example wire-bound electricity that conveys information about a phenomenon. For example, electrical signals may be any time varying voltage, current, or electromagnetic wave that carries information. In particular, electrical signals may be analog or digital signals. In some embodiments, the electrical signals transmitted in the electrical device are digital signals, i.e. a sequence of data elements (such as bits) changing between a logical value "0" and a logical value "1". When switching a digital signal between a logical value "0" and a logical value "1" noise may be created due to the signal switching event. Such a signal switching-based noise may be significantly larger for a digital signal than for an analog signal in which a signal change may lead to ramping, rather than to an abrupt high-low transition. In some embodiments, improvements due to the provision of shield wires are advantageously even more pronounced in case of digital signals. For instance, electrical signals may be high-frequency signals or high-speed signals.

In the context of the present application, the term "signal wire" may denote for example any elongate electrically conductive structure along which an electric signal may propagate. A signal wire may comprise a provision for coupling an electrical signal into the signal wire and a provision for coupling the electrical signal out of the signal wire. Hence, a first end of a signal wire may be connected with a signal source, whereas an opposing second end of a signal wire may be connected with a signal destination. For instance, a signal wire may be an electrically conductive trace or an electrically conductive cable.

In the context of the present application, the term "shield wire" may denote for example any elongate electrically conductive structure which may be specifically adapted and positioned to mutually shield neighboring signal wires for suppressing a capacitive and/or inductive coupling between said signal wires and between electrical signals propagating thereon. In particular, a neighboring signal wire of a shield wire may be a signal wire being located not further away from the shield wire than all other signal wires of the electrical device. A shield wire may be disabled from carrying and conducting itself an electrical signal. Hence, a first end of a shield wire may an unconnected free end, and an opposing second end of the shield wire may be a further unconnected free end. For instance, a shield wire may be an electrically conductive trace section or an electrically conductive cable piece. In some embodiments, a shield wire may be connected to an electric ground potential. This may be accomplished for example by a metallized via connecting the shield wire to a ground pad, ground line or ground plane.

Figure 4:
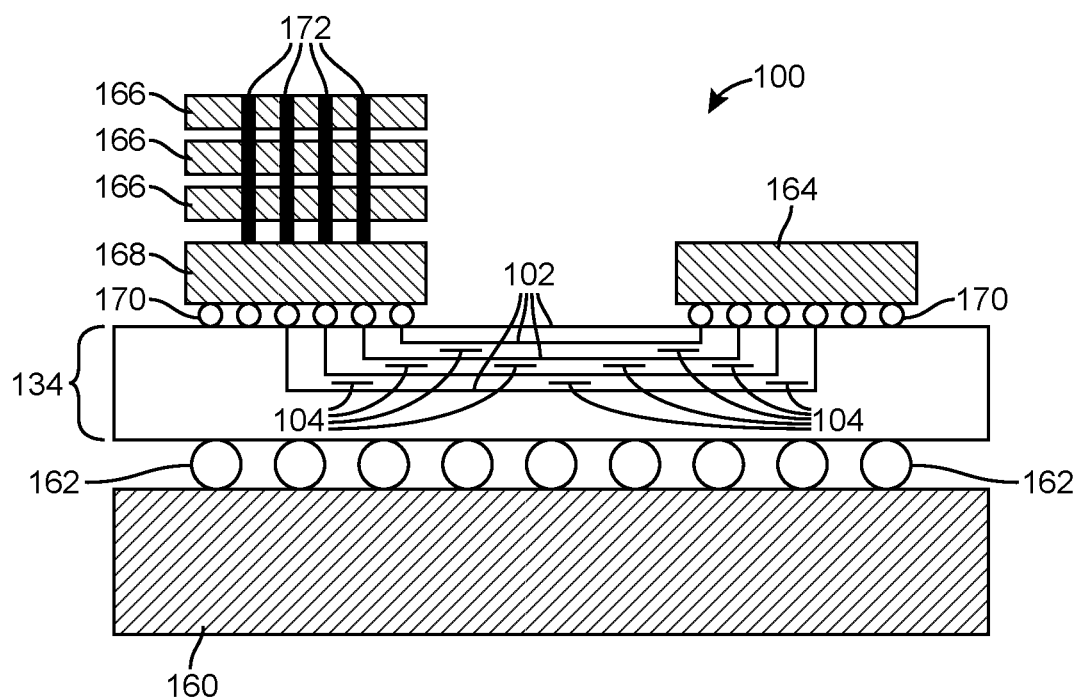
FIG. 4 a cross sectional view schematic diagram of an electrical device for transporting electrical signals according to still another embodiment.
Figure 2:
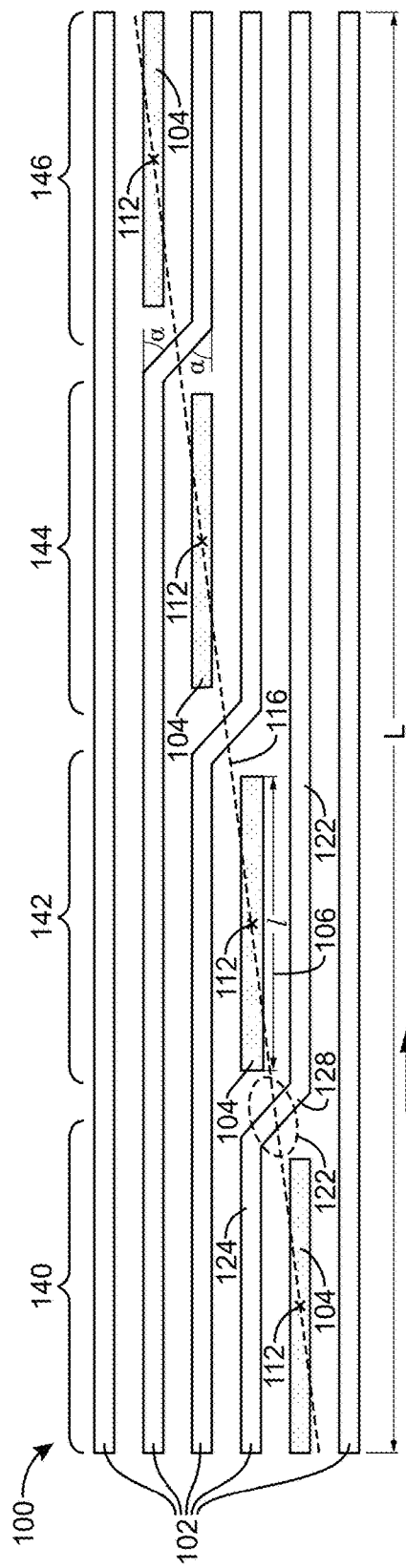
FIG. 2 a cross sectional view schematic diagram of an electrical device for transporting electrical signals according to an embodiment.
Figure 3:
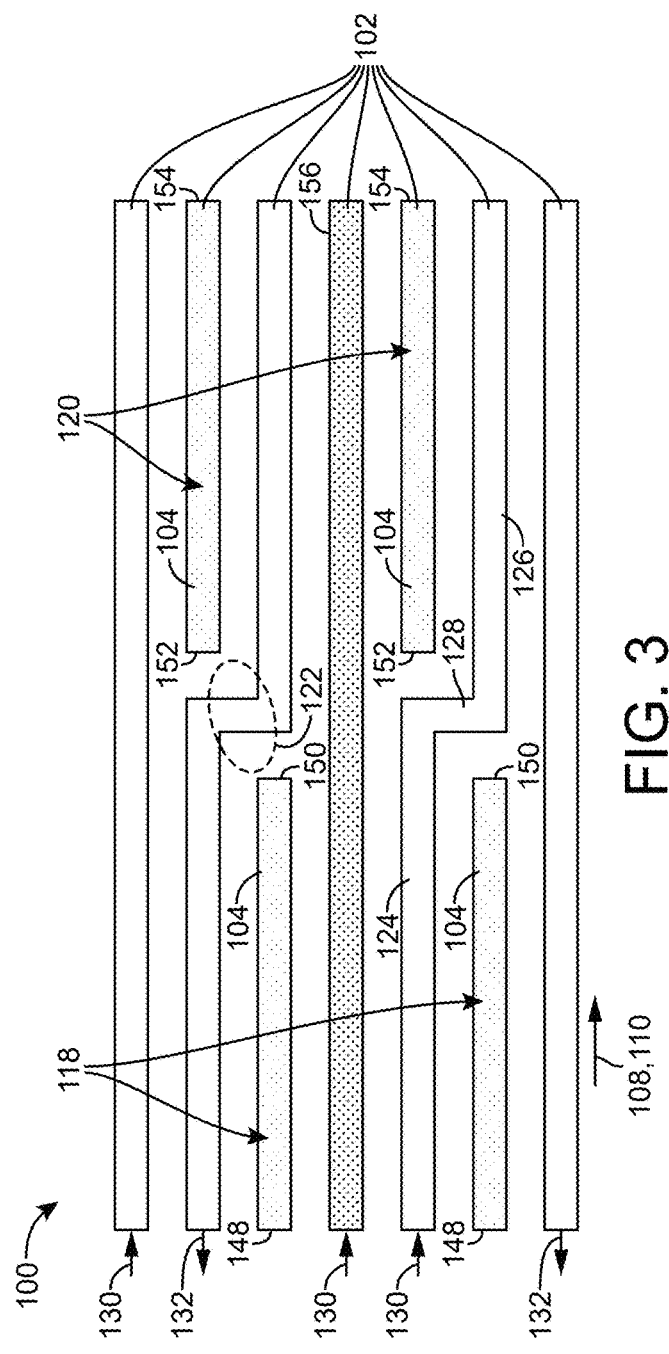
FIG. 3 a cross sectional view schematic diagram of an electrical device for transporting electrical signals according to another embodiment.

In the context of the present application, the term "staggered shield wires" may denote for instance that the shield wires may be—for example longitudinally and/or laterally—displaced, offset or shifted relative to each. In this context, a lateral direction may be perpendicular to a for example longitudinal extension direction of the shield wires. For example, staggered shield wires, each having a free leading end and a free trailing end, may be arranged so that not all free leading ends of the shield wires are in alignment with each other and/or not all free trailing ends of the shield wires are in alignment with each other. For example, the free leading ends of each pair of neighboring shield wires may be not in alignment with each other and/or the free trailing ends of each pair of neighboring shield wires may be not in alignment with each other. In one embodiment, all free leading ends of the shield wires may be not in alignment with each other and/or all free trailing ends of the shield wires may be not in alignment with each other. In an embodiment, a first shield wire of said pair may extend from a free leading end to a free trailing end, and a neighboring second shield wire of said pair may extend from a free leading end to a free trailing end, wherein a gap may exist between the free trailing end of the former shield wire and the free leading end of the latter shield wire. Examples for staggered shield wires are shown in FIG. 2 to FIG. 4.

In the context of the present application, the term "extending only along a subsection of each signal wire" may denote for example that a length of a shield wire neighboring to a signal wire is shorter than a length of said signal wire. In particular, that signal wire may extend from a leading end (where an electrical signal can be coupled into the signal wire) to a trailing end (where an electrical signal can be coupled out of the signal wire), and said shield wire may extend between a free leading end and a free trailing end, wherein a distance between said free leading end and said free trailing end of the shield wire may bridge only part of a distance between said leading end and said trailing end of said signal wire.

Generally, embodiments may allow to provide an electrical device for transporting electrical signals along signal wires between which shield wires are arranged for suppressing undesired signal-to-signal interactions of electrical signals propagating along the signal wires. This may reliably ensure signal integrity. Advantageously, shield wires inserted between signal wires may be provided with limited length, i.e. may be configured to be shorter than the signal wires so that the space consumption for taking measures against capacitive and/or inductive carryover between different signal lines can be kept small. By providing shield wires only along spatially limited subsections of assigned signal wires, less space is sufficient for the shield wires. Saved space may be used for accommodating signal wires and/or may be used for miniaturizing the electrical device. In some embodiments, the described shield wire configuration may render the electrical device more compact while ensuring high signal quality. Furthermore, it may be advantageous to mutually stagger the shield wires of limited spatial extension, which may promote reliable shielding of signal wires along different subsections thereof. By staggering the shield wires, a spatial distribution of the shield wires may be adjusted, for instance for homogenizing the shielding function.

By some embodiments, parasitic capacitive and/or inductive phenomena may be reduced whilst improving (or optionally even optimising) the area required to route transmitted electrical signals. Advantageously, shield wires may be inserted between signal wires along only a subportion of the respective signal wires, thereby limiting the additional routing space consumed by the shield wires. By reducing the space required for providing shield wires, an integrated circuit (IC) area may be kept reasonably small. As a result, a high effective bandwidth, i.e. a data transmission rate per length in a cross-section, may be achieved. A width of a parallel interface or bus may thus be decreased, which may result in a reduced footprint and thus a higher bandwidth as compared with conventional approaches with shield wires extending over the entire extension of neighboring signal wires. More specifically, by providing a staggered shielding of (for example integrated circuit (IC)) interconnects, signal integrity of high-speed signals propagating along miniature signal wires may be improved. Hence, excellent signal quality may be combined with a compact design of the corresponding electrical device.

In the following, further embodiments of the method, and the electrical device will be explained:

In an embodiment, the signal wires extend along a substantially straight signal wire extension direction. In some embodiments, the shield wires may extend as well along the substantially straight signal wire extension direction. Hence, a main direction of signal propagation may be substantially straight corresponding to a substantially straight orientation of the signal wires. However, a short subsection of the signal wires may be inclined (see for instance FIG. 2), thereby involving a slight deviation from a strictly straight signal wire extension direction. The shield wires may extend along the same direction as the signal wires, which may ensure a pronounced shielding function. The described configuration of signal wires and shield wires may be applied advantageously in particular for applications requiring signal transport in terms of parallel interfaces.

In an embodiment, each of the staggered shield wires is free of a spatial overlap with at least one neighboring shield wire (see for example FIG. 3) or even any other staggered shield wire (see for example FIG. 2) along a shield wire extension direction. Such a geometry may promote short connection paths of subsections of a respective signal wire extending through a gap between the non-overlapping shield wires.

In an embodiment, the staggered shield wires are arranged so that each pair of neighboring shield wires is displaced relative to each other along a shield wire extension direction and perpendicular to said shield wire extension direction. Thus, there may be both a longitudinal as well as a lateral offset between adjacent shield wires. In particular, a neighboring shield wire of another shield wire may be a shield wire being located not further away from the other shield wire than all remaining shield wires of the electrical device. By a mutual offset between neighboring or adjacent shield wires both in a longitudinal and in a transverse direction of the shield wire extension, a spatially distributed shielding function may be provided to the various signal wires.

In an embodiment, the staggered shield wires are arranged so that centers of gravity of three or more of the shield wires are positioned along a straight connection line. In some embodiments, the straight connection line may be inclined with respect to a shield wire extension direction. An inclination angle may be larger than 0° and smaller than 90°, for instance in a range from 20° to 70°. A corresponding embodiment is shown in FIG. 2 and may allow to provide an efficient shielding function to the signal wires while requiring only a very small amount of space for arranging shield wires.

In an embodiment, the staggered shield wires form a stairway pattern (compare again FIG. 2). Each stair of such a stairway pattern may be formed by a respective shield wire. Consecutive stairs may be shifted both along an extension direction of the assigned shield wire as well as perpendicular to said extension direction. Furthermore, consecutive stairs may be separated by gaps in two orthogonal spatial directions. This leads to an efficient distribution of shielding over the array of signal wires with small space consumption by the shield wires.

In an embodiment, the staggered shield wires comprise a first shield wire group being aligned along a shield wire extension direction and comprise a second shield wire group being aligned along the shield wire extension direction, and wherein the shield wires of the first shield wire group are displaced with respect to the shield wires of the second shield wire group along the shield wire extension direction and perpendicular to said shield wire extension direction. In some embodiments, the shield wires of the first shield wire group and the shield wires of the second shield wire group may be arranged alternatingly perpendicular to said shield wire extension direction. Such a configuration of alternating shield wires assigned to different shield wire groups is shown for instance in FIG. 3. Gaps may be formed between the groups of shield wires for guiding signal wires through said gaps. Also the described configuration combines efficient shielding of signal wires with a compact design.

In an embodiment, at least one of the signal wires extends through a gap between neighboring ones of the staggered shield wires. The opportunity to guide signal wires through gaps between different shield wires, each extending only along a respective subsection of a neighboring signal wire, may increase the flexibility of design of signal wiring. In contrast to conventional approaches in which shield wires extend along the entire extension of functionally assigned signal wires, the provision of short segment-type shield wires allows to guide signal wires along more flexibly selectable trajectories, including trajectories reaching through gaps between shield wires.

In an embodiment, said at least one of the signal wires guided through a gap between adjacent shield wires comprises two straight sections connected by an angled section extending through the gap. For instance, said angled section may be inclined or slanted (as in FIG. 2) or may be perpendicular or right-angled (as in FIG. 3) with respect to said two straight sections. In some embodiments, an overall length of said straight sections may be significantly larger than (in particular at least three times of, more particularly at least five times of) said angled section. This may increase the flexibility of design while achieving compliance with needs of parallel interfaces.

In an embodiment, each shield wire is arranged between a respective pair of signal wires and extends only along a subsection of each signal wire of the respective pair. Thus, both opposing sides of the elongate and nevertheless spatially limited shield wire may face a respective signal wire and may extend only along a sub-portion thereof.

In an embodiment, a ratio between a length of a respective one of the shield wires and a length of a respective one of the signal wires neighboring to the respective one of the shield wires is in a range from 0.2 to 0.5. For example, the ratio may be smaller than 0.3. Correspondingly, a number of shield wires extending along a signal wire extension direction of a respective one of the signal wires may be in a range from 2 to 4. It is however also possible that the number is larger than 4.

In an embodiment, for at least some of the signal wires, one of said shield wires is located on one side and another one of said shield wires is located on an opposing other side of the respective signal wire so that each of said shield wires shields said signal wire with respect to neighboring signal wires along a respective subsection of said signal wire. The two shield wires may be displaced with respect to each other along a substantially or exactly longitudinal extension of the signal wires in between. In some embodiments, each of said shield wires may shield different portions of the signal wire in between with regard to a parasitic capacitive or inductive coupling with other signal wires.

In an embodiment, the shield wires extend parallel to each other. Correspondingly, the signal wires may extend substantially parallel to each other. For instance, major portions of the signal wires may extend entirely straight, for instance with the exception of one or more angled sections between straight connection sections. In some embodiments, the shield wires and the signal wires extend substantially parallel to each other. The straight connection sections of the signal wires and the entire shield wires may even extend strictly parallel to each other. This may contribute to a space-saving configuration. For instance, an alternating sequence of signal wires and shield wires may be formed transverse to the parallel or at least substantially parallel extension of both types of wires.

In an embodiment, the shield wires and the signal wires are coplanar. In other words, all shield wires and all signal wires may lie in one common plane. The obtained planar structure or wiring plane may lead to a compact configuration of the electrical device.

In an embodiment, the shield wires and the signal wires are arranged in at least two vertically displaced planes. For example, the shield wires may be arranged with one common plane located between two other planes in which two groups of signal wires are located.

In some embodiments, the shield wires can inserted on the same layer between signal wires, inserted periodically between a collection of wires, placed on layers above, on layers below, or any combinations of these methods, depending on where parasitic capacitive and/or inductive coupling shall be suppressed. The signal wires and shield wires can be functionally coupled horizontally and/or vertically.

In an embodiment, the shield wires and the signal wires are arranged so that an effective shielding strength of the signal wires is substantially identical or spatially homogeneous. In the context of the present application, the term "effective shielding strength" may denote a quantitative measure for the shielding of a signal wire with respect to parasitic interference with other signal wires by one or more functionally assigned shield wires. In particular, a substantially identical or spatially homogeneous effective shielding strength over all signal wires may correspond to a homogeneous signal quality of electrical signals propagating along the various signal wires. By ensuring substantially identical shield strength at different signal wires, significant variations of signal integrity of electrical signals traveling along different signal wires may be avoided. A homogeneous level of signal integrity may be achieved by electrical signals traveling on all signal wires. This may be obtained by an arrangement of the shield wires according to which an effective length of shield wires neighboring a respective signal wire is substantially homogeneous for the different signal wires.

In an embodiment, the shield wires are configured for shielding the signal wires for suppressing at least one of capacitive and inductive crosstalk. To put it shortly, in case of a switching event of a digital signal propagating along a respective one of the signal wires, a neighboring shield wire may form an electromagnetic return path for signal noise created by signal switching on the respective signal wire. This return path may inhibit parasitic effects from other signal wires. This function may be promoted by grounding the shield wires, i.e. coupling the shield wires with mass potential. Thus, the shield wires may be tied to ground.

In an embodiment, neighboring pairs of the signal wires are configured for transmitting electrical signals with mutually inverse propagation directions. In some embodiments, signal propagation directions along adjacent signal wires may also be parallel. In both cases, the staggering design of the shield wires extending only along a subportion of the signal wires may be effective for suppressing parasitic capacitive or inductive coupling.

In an embodiment, the electrical device is configured as routing device for routing the electrical signals. In electronic design, wire routing may denote for example a process in the design of electrical devices such as printed circuit boards (PCBs) and integrated circuits (ICs). Wire routing may build on a preceding process, i.e. placement, which determines the location of each active element of an IC or component on a PCB. After placement, the routing process may add signal wires to properly connect the placed components while complying with design rules for the IC. Together, the placement and routing processes of IC design may be denoted as place and route. More specifically, the electrical device may be configured as integrated circuit (IC) routing device for routing high-speed electrical signals. In this context, the staggered and spatially limited shield wires may guarantee proper signal quality.

In an embodiment, the signal wires and the shield wires form part of an interposer. An interposer may for example denote an electrical interface routing between one connection to another connection. In particular, a purpose of such an interposer may be to spread a connection to a wider pitch or to re-route a connection to a different connection. Such a routing function may be fulfilled by the signal wires, whereas the shield wires may ensure signal integrity during routing by suppressing parasitic capacitive and inductive phenomena.

In an embodiment, the signal wires and the shield wires are arranged in a repeating pattern. By taking this measure, it can be ensured that the shielding function is provided over the distributed arrangement of the signal wires in a homogeneous way or near homogeneous in accordance with a spatially repetitive pattern. For instance, the arrangement of shield wires may be periodically along an array of signal wires. Advantageously, a repeating pattern of spatially limited shield wires may be arranged between signal wires of longer extension.

According to an embodiment, the shield wires may be created shorter than functionally coupled signal wires, e.g. may be not continuous along their length. Moreover, saved space where shield wires are not present due to the reduced length in comparison with the neighboring signal wires may be used for accommodating signal wires. Thereby, the density of signal wires may be increased and/or the dimensions of the electrical device may be reduced. In an advantageous embodiment, for any given region along the path of the signal wires, not all signal wires (but for instance only a part) may be shielded in that section. In advantageous designs, a shield wire location may be alternated or cycled across different signal wires. Further advantageously, a shield and signal wire pattern can be repeated or staggered so that all signal wires are shielded by similar proportions across a larger distance. This may ensure homogeneous signal integrity over the entire electrical device. For example, the pattern can be adopted for shield wires and signal wires on the same layer, on layers above and below, or combinations of both.

An application of embodiments may be, but is not limited to, parallel interfaces, such as a parallel bus. A parallel interface may send multiple electrical signals (in particular bits of data) by parallel communication. For this purpose, a parallel interface may implement multiple data lines in form of the signal wires. Hence, the signal wires may be parallel signal wires.

Advantageously, the electrical device may be embodied as High Bandwidth Memory (HBM) device. An HBM may be a high-speed computer memory interface for three-dimensionally stacked synchronous dynamic random-access memory (SDRAM). For example, an HBM may be used in conjunction with high-performance graphics accelerators, network devices, high-performance datacenter AI (artificial intelligence) ASICs (application-specific integrated circuits) and FPGAs (field programmable gate array). Advantageously, an arrangement of spatially limited shield wires between signal wires may contribute to a fast HBM speed with high signal quality.

FIG. 1 illustrates a flow 200 of a method of manufacturing an electrical device 100 for transporting electrical signals according to an embodiment. Concerning the reference signs used for the description of FIG. 1, reference is made in particular to FIG. 2 to FIG. 4.

Referring to operation 202, the method includes configuring a number of signal wires 102 for transporting electrical signals.

Referring to operation 204, the method includes staggering a number of shield wires 104 with respect to each other for shielding the signal wires 102 with respect to each other.

Referring to operation 206, the method comprises arranging each shield wire 104 between a respective pair of signal wires 102 so that each shield wire 104 extends only along a subsection 106 of each signal wire 102 of the respective pair.

FIG. 2 illustrates an electrical device 100 for transporting electrical signals according to an embodiment.

The electrical device 100 illustrated in FIG. 2 serves for transporting electrical signals, in particular in a parallel interface. The electrical signals may be digital signals. The electrical signals, which may for instance be high-speed signals transmitted in terms of operating one or more integrated circuits (ICs) can be transmitted within a transmission plane which may correspond to the paper plane of FIG. 2. For this purpose, the electrical device 100 includes a plurality of electrically conductive structures, such as metallic structures. Said electrically conductive structures may be formed on and/or may be embedded in a dielectric matrix or in a semiconductor matrix to electrically decouple the various electrically conductive structures described in the following with respect to each other.

As part of said electrically conductive structures, the electrical device 100 comprises a plurality of signal wires 102 each configured for transporting electrical signals. Said signal wires 102 may from an array of metallic traces which may conduct electrical signals in parallel and may thus function as a bus, more specifically as a parallel bus. For instance, said signal wires 102 may be electrically conductive traces (e.g., with a width of 1.5-12 mil and a similar pitch) or electrically conductive cables (e.g., with a pitch of 0.025 inches to 0.1 inches and gauge of 22, 24, 26, 28, 30, 32, 34, 36, 38, or 40). Each of said signal wires 102 may function as a data link for transmitting data in the form of electrical signals propagating along the signal wires 102 between a signal inlet and a signal outlet. Referring to FIG. 2, a signal inlet of a respective signal wire 102 may be formed by a respective end of the respective signal wire 102 on the left-hand side or on the right-hand side of FIG. 2. Correspondingly, a signal outlet of the respective signal wire 102 may be formed by the respective other end on the right-hand side or on the left-hand side of FIG. 2. According to FIG. 2, the electric signals propagate along a substantially horizontal direction. When digital electrical signals are transmitted over multiple signal wires 102 simultaneously or sequentially with high-speed, signal wires 102 being located sufficiently close to each other may experience a capacitive and/or an inductive coupling. Such a capacitive and/or inductive coupling caused by electric signals propagating along signal wires 102 in vicinity may deteriorate signal quality.

In order to promote signal integrity in the electrical device 100 despite of the aforementioned capacitive and/or inductive coupling phenomena, a plurality of shield wires 104 may be arranged between the signal wires 102. Descriptively speaking, in a switching event of a digital signal propagating along a respective one of the signal wires 102, a neighboring shield wire 104 may form a return path for noise created by signal switching on a signal wire 102. By this mechanism, the shield wire 104 may shield parasitic effects from other signal wires 102 in an environment. No electrical signals propagate along shield wires 104, which may be electrically coupled structures tied to ground. For example, a respective shield wire 104 may be connected to an electric reference potential (such as a mass potential or $V_{ss}$). This may be accomplished by connecting a respective shield wire 104 or even all shield wires 104 of an electrical device 100 to a reference potential by metal-filled vias each extending from a respective shield wire 104 perpendicular to an extension of the shield wires 104 (in particular extending perpendicular to the paper plane of FIG. 2).

As shown in FIG. 2, the shield wires 104 are arranged in a staggered fashion. Thus, the shield wires 104, which do not extend along the entire extension of the adjacent signal wires 102, are spatially displaced or offset relatively to each other. In view of the described configuration, the shield wires 104 being interposed between different signal wires may electrically shield signal wires 102 with respect to each other. As a result, the above-described capacitive and/or inductive parasitic coupling between electrical signals propagating along juxtaposed signal wires may be efficiently suppressed.

Advantageously, each of the staggering shield wires 104 may be arranged between a respective pair of signal wires 102. Specifically, each shield wire 104 extends in parallel between parallel sections of a respective pair of neighboring signal wires 102. However, each shield wire 104 extends only along a subsection 106 of each signal wire 102 of the respective pair, rather than extending along the entire length of the neighboring signal wires 102. As a result, a plurality of shield sections 140, 142, 144, 146 are created, the shield sections 140, 142, 144, 146 extending longitudinally between the signal inlets and the second outlets of the substantially straight signal wires 102. For example, all straight shield wires 104 have the same length, l, being smaller than an effective longitudinal length, L, of each of the substantially straight signal wires 102 between a respective signal inlet and a respective signal outlet. Each shield section 140, 142, 144, 146 may have one assigned shield wire 104, or may have a plurality of mutually spaced longitudinally aligned shield wires 104 (not shown). In some embodiments, a first shield section 140 extends along the lowermost shield wire 104 according to FIG. 2 and is arranged between the two lowermost substantially straight signal wires 102 according to FIG. 2. A second shield section 142 extends along the horizontally and vertically next shield wire 104 according to FIG. 2 and is arranged between two substantially straight signal wires 102 next to the lowermost signal wire 102 according to FIG. 2. A third shield section 144 extends along the horizontally and vertically next shield wire 104 according to FIG. 2 and is arranged between two substantially straight signal wires 102 next to the aforementioned second signal wire 102 according to FIG. 2. A fourth shield section 146 extends along the uppermost shield wire 104 according to FIG. 2 and is arranged between the two uppermost substantially straight signal wires 102 according to FIG. 2. Many other configurations and many dimensions are possible.

According to FIG. 2, the signal wires 102 extend along a substantially straight signal wire extension direction 108. Only a short angled section 128 of a respective signal wire 102 leads to a slight deviation from a purely straight geometry of the signal wires 102 in some embodiments. Correspondingly, the shield wires 104 extend straight along the substantially straight signal wire extension direction 108. As a result, signal wire extension direction 108 corresponds to a shield wire extension direction 110. This leads to a compact design and promotes a parallel signal transmission in some embodiments.

As shown in FIG. 2 as well, each of the staggered shield wires 104 is free of a spatial overlap with any other staggered shield wire 104 along the shield wire extension direction 110. Moreover, the staggered shield wires 104 are arranged so that each pair of neighboring shield wires 104 is displaced relative to each other along the shield wire extension direction 110 and perpendicular to said shield wire extension direction 110. As a result, gaps 128 are formed between longitudinally adjacent shield wires 104. Advantageously, a respective signal wire 102 may extend through a respective gap 122 between a neighboring pair of the staggered shield wires 104. Furthermore, the staggered shield wires 104 are arranged so that centers of gravity 112 of the shield wires 104 are positioned along a virtual straight connection line 116 being inclined with respect to a shield wire extension direction 110.

Due to the described configuration, the staggered shield wires 104 form a stairway pattern shown in FIG. 2. In view of the symmetry of the stairway pattern, the shield wires 104 are arranged in a repeating pattern according to FIG. 2.

Again referring to FIG. 2, some of the signal wires 102 may be entirely straight (namely the uppermost and lowermost signal wires 102 according to FIG. 2). Furthermore, each of the remaining intermediate signal wires 102 between the entirely straight signal wires 102 comprises two straight sections 124, 126. Each straight section 124, 126 extends along extension directions 108, 110. The straight sections 124, 126 of a common signal wire 102 are connected with each other by an angled section 128 extending through a respective gap 122 between adjacent shield wires 104. In each intermediate signal wire 102, the straight sections 124, 126 and the angled section 128 in between form a continuous integral electrically conductive wiring structure along which an electrical signal may propagate. According to FIG. 2, said angled section 128 is inclined with respect to said two assigned straight sections 124, 126. For example, an inclination angle, a, of the angled section 128 relative to any of straight sections 124 may be in a range from 10° to 60°. Said straight sections 124, 126 extend parallel to said neighboring ones of the staggered shield wires 104 defining the gap 122 between them through which the angled section 128 extends. Straight section 124 is aligned with one of said pair of shield wires 104 and extends in parallel to the other one of said pair of shield wires 104, while straight section 126 is aligned with said other one of said pair of shield wires 104 and extends in parallel to the first mentioned one of said pair of shield wires 104. By the described architecture of guiding angled sections 128 of signal wires 102 through gaps 122 between longitudinally adjacent shield wires 104, a high flexibility of design may be combined with an efficient suppression of parasitic capacitors and/or inductive coupling between signal wires 102.

As already mentioned, each shield wire 104 is arranged between a respective pair of signal wires 102 and extends only along a respective subsection 106 of each signal wire 102 of the respective pair. A ratio between a length, l, of a respective one of the shield wires 104 and an effective horizontal length, L, of a respective one of the signal wires 102 neighboring to said respective one of the shield wires 104 may be for example 0.2.

Now referring specifically to the aforementioned intermediate signal wires 102 in FIG. 2, a respective one of said shield wires 104 is located on one side and another one of said shield wires 104 is located longitudinally displaced with respect to said one of said shield wires 104 on an opposing other side of the respective intermediate signal wire 102 so that each of said shield wires 104 shields said signal wire 102 with respect to neighboring signal wires 102 along a respective one of different subsections 106 of said signal wire 102. In combination with the staggered arrangement of the shield wires 104 in the staircase fashion of FIG. 2, this leads to an efficient suppression of capacitive and/or inductive coupling between juxtaposed signal wires 102 by the shield wires 104 distributed along the various shield sections 140, 142, 144, 146 of FIG. 2. At the same time, the space consumption of the shield wires 104 may be kept very small with the configuration according to FIG. 2.

In the embodiment of FIG. 2, the shield wires 104 and the signal wires 102 are coplanar, i.e. are located or within the paper plane of FIG. 2. Thus, a parallel signal interface with multiple signal connections may be formed in a planar way and therefore with small space consumption.

Furthermore, the described configuration of the shield wires 104 and the signal wires 102 may lead to an effective shielding strength of the signal wires 102 being substantially identical. Hence, a homogeneously high signal integrity may be achieved for all signal wires 102 due to the distributed arrangement of the spatially limited shield wires 104 arranged in a repeating symmetric pattern. The described configuration of the shield wires 104 may efficiently shield the signal wires 102 to thereby strongly suppress undesired parasitic capacitive and inductive crosstalk between signal wires 102.

As described, the embodiment of FIG. 2 may be used as routing device for routing the electrical signals. More specifically, the electrical device 100 according to FIG. 2 can be configured as integrated circuit (IC) routing device for routing digital high-speed electrical signals.

By the arrangement of shield wires 104 in relation to signal wires 102 corresponding to FIG. 2, efficient shielding and thereby suppression of parasitic capacitive and/or inductive coupling phenomena may be achieved while simultaneously maintaining the space consumption of the shield wires 104 small. Thus, a compact design may be combined with reliable signal integrity.

Thus, FIG. 2 relates to an embodiment in which shield wires 104 are inserted between signal wires 102 or groups of signal wires 102, but only for limited lengths, l. The space where no shield wires 104 exist can be used for accommodating signal wires 102 or sections thereof. In particular, signal wires 102 may be guided through partially longitudinal and partially transverse gaps 122 between shield wires 104 arranged side-by-side.

By using the geometric parameters of the arrangement of FIG. 2 as design parameters, the ratio of space occupied by shield wires versus signal wires can be adjusted or even optimised for a coupling versus space relation of a specific application. For example, the ratio of lengths l and L, and/or a number of shield wires 104 in a respective shield section 140, 142, 144, 146, can be adjusted or even optimized based on a target data rate and one or more predefined signal integrity criteria. Furthermore, the pattern of signal wires 102 and shield wires 104 can be repeated at predefined intervals so that portions of all signal wires 102 may be shielded sufficiently. In the example of FIG. 2, each signal wire 102 may have one or two assigned shield wires 104 each extending along for example 20% to 25% of its effective length, L.

Although not shown in the embodiment of FIG. 2, the illustrated shield wires 104 may be provided with different lengths. Furthermore, it is possible to add further shield wires 104 in FIG. 2, so that a plurality of shield wires 104 are aligned or overlap in vertical direction. By using the mentioned and/or other degrees of freedom concerning the arrangement of shield wires 104 in relation to the arrangement of signal wires 102, a proper trade-off between space consumption and signal integrity may be made.

FIG. 3 illustrates an electrical device 100 for transporting electrical signals according to another embodiment.

FIG. 3 illustrates by arrows that neighboring pairs of signal wires 102 may be configured for transmitting electrical signals with mutually inverse propagation directions 130, 132. More precisely, arrows labelled 130 and pointing from left to right according to FIG. 3 may relate to signal wires 102 along which electrical signals propagate from the left-hand side to the right-hand side of FIG. 3. Furthermore, arrows labelled 132 and pointing from right to left according to FIG. 3 may relate to signal wires 102 along which electrical signals propagate from the right-hand side to the left-hand side of FIG. 3. The described and illustrated configuration of shield wires 104 in relation to signal wires 102 may allow to efficiently suppress capacitive and/or inductive coupling between signal wires 102 both for parallel as well as for antiparallel propagation directions of adjacent signal wires 102.

Again referring to FIG. 3, the shown staggered shield wires 104 comprise a first shield wire group 118 being mutually aligned along shield wire extension direction 110. Thus, free trailing ends 148 of the shield wires 104 of the first shield wire group 118 may be aligned, i.e. may flush along a vertical direction according to FIG. 3. Correspondingly, free leading ends 150 of the shield wires 104 of the first shield wire group 118 may be aligned, i.e. may flush along a vertical direction according to FIG. 3. Furthermore, the shield wires 104 of FIG. 3 comprise a second shield wire group 120 being aligned as well along the shield wire extension direction 110. Hence, free trailing ends 152 of the shield wires 104 of the second shield wire group 120 may be aligned, i.e. may flush along a vertical direction according to FIG. 3. Correspondingly, free leading ends 154 of the shield wires 104 of the second shield wire group 120 may be aligned, i.e. may flush along a vertical direction according to FIG. 3. As shown in FIG. 3, the shield wires 104 of the first shield wire group 118 are displaced with respect to the shield wires 104 of the second shield wire group 120 along the shield wire extension direction 110 and perpendicular to said shield wire extension direction 110. As a result, the shield wires 104 of the first shield wire group 118 and the shield wires 104 of the second shield wire group 120 are arranged alternatingly perpendicular to said shield wire extension direction 110. The shield wires 104 are arranged in a repeating pattern of shield wire groups 118, 120 according to FIG. 3. The alternating staggering arrangement of mutually offset or displaced shield wires 104 according to FIG. 3 may promote signal integrity while keeping the space consumption for shielding small.

Also in FIG. 3, intermediate signal wires 102 comprise two straight sections 124, 126 aligned along extension directions 108, 110 and being connected with each other by an angled section 128 extending through a partially horizontal and partially vertical gap 122 between adjacent shield wires 104. According to FIG. 3, said angled sections 128 extend perpendicular with respect to said straight sections 124, 126 and thus perpendicular to said extension directions 108, 110.

During operation of the electrical device 100 according to FIG. 3, it is for instance possible that central signal wire 102, labelled 156 in FIG. 3, operates as aggressor wire, i.e. as source or cause for undesired capacitive and/or inductive coupling with other signal wires 102. Said other signal wires 102 may be denoted as victim signal wires being victims of said capacitive and/or inductive coupling which may deteriorate signal integrity on the victim signal wires. The shown arrangement of shield wires 104 protects the victim signal wires from excessive capacitive and/or inductive coupling phenomena resulting from aggressor wire 156.

Also in the embodiment of FIG. 3, shield wires 104 are inserted between signal wires 102 or groups of signal wires 102, but only with limited lengths, l. Advantageously, the space where no shields exist can be used for accommodating signal wires 104. The ratio of space occupied by shield wires 104 versus signal wires 100 can be adjusted or even optimised for an expected coupling versus space characteristic desired or required for a certain application.

FIG. 4 illustrates an electrical device 100 for transporting electrical signals according to still another embodiment. The electrical device 100 according to FIG. 4 may be embodied as High-Bandwidth Memory (HBM).

The illustrated electrical device 100 comprises a substrate 160, such as a package substrate or a printed circuit board (PCB). Solder structures 162, for instance solder balls, electrically and mechanically connect the substrate 160 with an interposer 134, which may be a silicon-based interposer. An arrangement of staggered and spatially limited shield wires 104 and signal wires 102 are arranged in the interposer 134, for instance in a plurality of vertically displaced planes. Thus, the signal wires 102 and the shield wires 104 form part of the interposer 134 in the embodiment of FIG. 4. For instance, 1024 data links may be formed by signal wires 102 in interposer 134. Thus, FIG. 4 illustrates the electrical device 100 in a simplified way.

The interposer 134 and in particular the signal wires 102 thereof electrically couple a processor 164 (such as a graphics processing unit, GPU, or a central processing unit, CPU) with one or more memories 166 via a controller chip 168. Processor 164 may be embodied as at least one semiconductor chip. Each of the memories 166 may be embodied as at least one semiconductor chip. Controller chip 168 may be embodied as semiconductor chip as well. The plurality of memories 166 may be vertically stacked and may be interconnected for example by through silicon vias 172. An electric and mechanical connection between the interposer 134 on the one hand and each of the processor 164 and the controller chip 168 can be accomplished by further solder structures 170, such as further solder balls. As shown, the signal wires 102 of interposer 134 electrically transmit electrical signals between processor 164 and memories 166 via controller chip 168. The staggered stub-shaped shield wires 104 ensure signal integrity with low space consumption when high-speed digital signals are transmitted.

Figure 5:
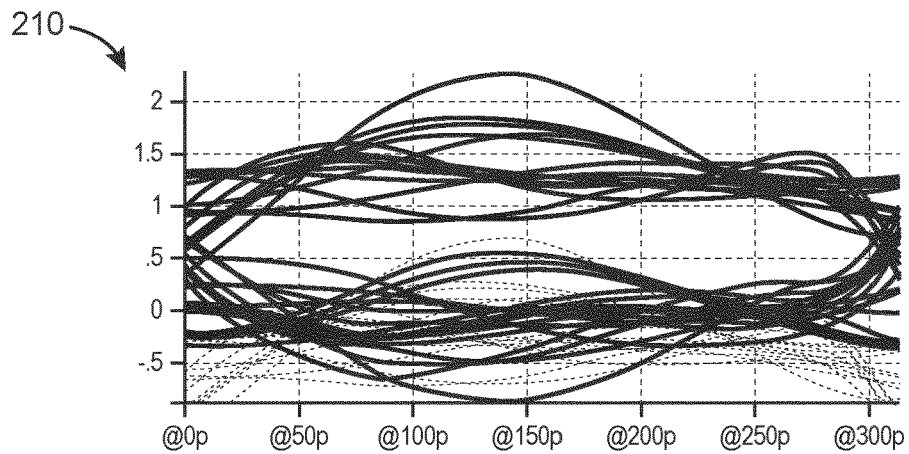
FIG. 5 is an eye diagram for a conventional electrical device without shielding.
Figure 6:
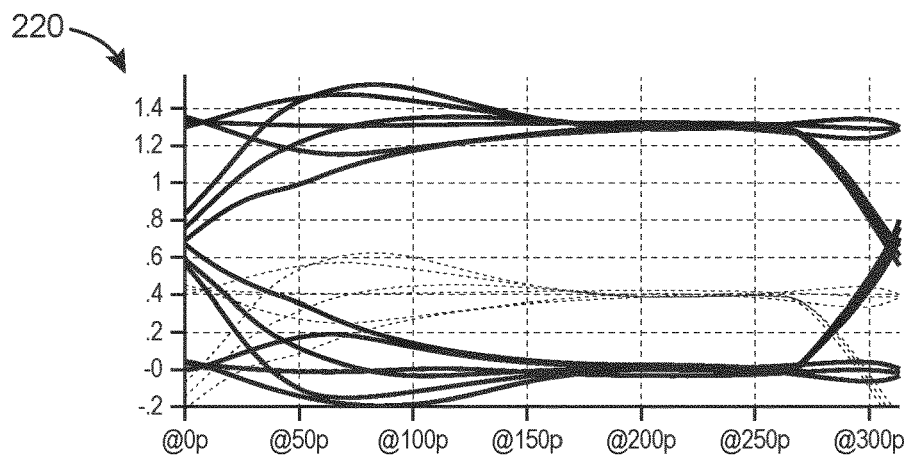
FIG. 6 is an eye diagram for another conventional electrical device with high effort shielding.
Figure 7:
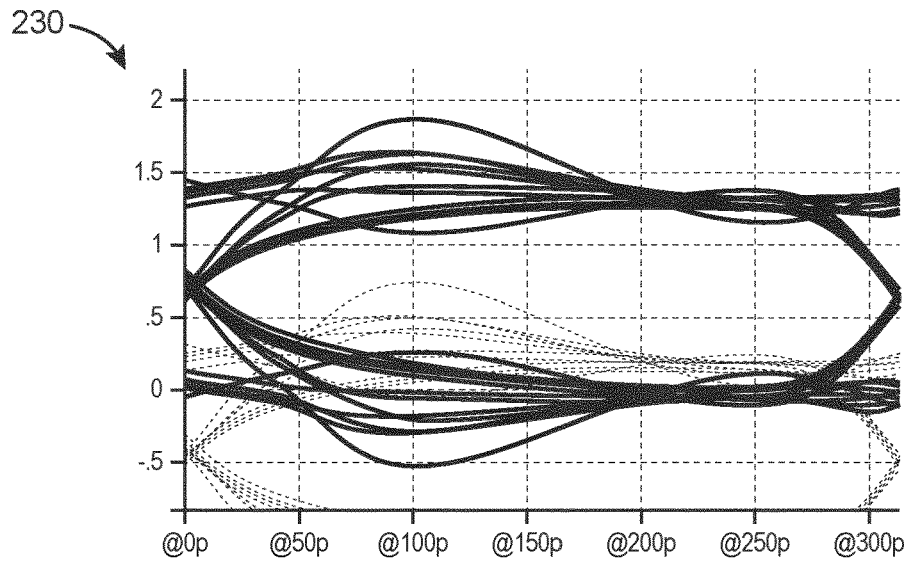
FIG. 7 is an eye diagram for an electrical device according to an embodiment.

FIG. 5 to FIG. 7 illustrate eye diagrams 210, 220, 230 comparing signal quality for conventional electrical devices with signal quality of an electrical device 100 according to an embodiment. The illustrated eye diagrams 210, 220, 230 shown simulations of digital signals transmitted over signal wires of a respective electrical device and being repetitively sampled. More specifically, the eye diagrams 210, 220, 230 show switching transitions between logical values "0" and logical values "1". The eye diagrams are a tool for the evaluation of signal integrity and may indicate parasitic and noise phenomena.

FIG. 5 illustrates an eye diagram 210 for a conventional electrical device in which no shield wires are implemented.

FIG. 6 illustrates an eye diagram 220 for another conventional electrical device with shield wires extending along an entire extension of signal wires.

FIG. 7 illustrates an eye diagram 230 for an electrical device 100 according to an embodiment with staggered stub-shaped shield wires 104 each arranged only along a subsection of a respective signal wire 102. In the example eye diagram 230, only two of every three wires are shielded for the staggered shield case along a distance of 450 μm. For the next 450 μm distance, a different set of two wires are shielded, and so on.

As shown, signal quality is significantly better in FIG. 6 and FIG. 7 as compared with FIG. 5. However, the space consumption for shielding features is significantly lower in FIG. 7 as compared to FIG. 6. Therefore, embodiments according to FIG. 7 may ensure signal integrity and a compact design at the same time and therefore provide a significant improvement over the conventional approaches according to FIG. 5 and FIG. 6.

Advantageously, the ratio of space occupied by shield versus signal wires can be adjusted or even optimized for particular, packages, applications, devices, etc. Such an adjustment may be carried out in accordance with an expected coupling versus available routing space. Consequently, less space may be sufficient for providing the shield wires since the shielding feature can be adjusted or even optimised for a target data rate.

It should be noted that certain passages of this disclosure may reference terms such as "first" and "second" in connection with devices, mode of operation, transmit chains, etc., for purposes of identifying or differentiating one from another or from others. These terms are not intended to merely relate entities (for instance, a first device and a second device) temporally or according to a sequence, although in some cases, these entities may include such a relationship. Nor do these terms limit the number of possible entities (for instance, devices) that may operate within a system or environment.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Having now described some illustrative embodiments, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed only in connection with one implementation are not intended to be excluded from a similar role in other embodiments or embodiments.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate embodiments consisting of the items listed thereafter exclusively. In one implementation, the systems and methods described herein consist of one, each combination of more than one, or all of the described elements, acts, or components.

Any references to embodiments or elements or acts of the systems and methods herein referred to in the singular can also embrace embodiments including a plurality of these elements, and any references in plural to any implementation or element or act herein can also embrace embodiments including only a single element. References in the singular or plural form are not intended to limit the presently disclosed systems or methods, their components, acts, or elements to single or plural configurations. References to any act or element being based on any information, act or element can include embodiments where the act or element is based at least in part on any information, act, or element.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein.

References to "or" can be construed as inclusive so that any terms described using "or" can indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein can be embodied in other specific forms without departing from the characteristics thereof. The foregoing embodiments are illustrative rather than limiting of the described systems and methods. The scope of the systems and methods described herein can thus be indicated by the appended claims, rather than the foregoing description, and changes that come within the meaning and range of equivalency of the claims are embraced therein.

We claim:

1. An electrical device for transporting electrical signals, wherein the electrical device comprises:
   a plurality of signal wires each configured for transporting electrical signals; and
   a plurality of staggered shield wires being staggered with respect to each other and each being configured for shielding the signal wires with respect to each other;
   wherein each shield wire is arranged between a respective pair of signal wires and extends only along a subsection of each signal wire of the respective pair, wherein the signal wires are arranged in a stair configuration comprising a first signal wire, a second signal wire and a third signal wire, and wherein a first shield wire of the shield wires is disposed in a first respective gap in the stair configuration between the first signal wire and the second signal wire, wherein a second shield wire of the shield wires is disposed in a second respective gap in the stair configuration between the third signal wire and the second signal wire, wherein the first signal wire is adjacent the second signal wire outside of the first respective gap and the third signal wire is adjacent the second signal wire outside of the second respective gap, wherein the first shield wire is not provided between the first signal wire and the second signal wire along a full length of the first signal wire and the second signal wire, wherein the second shield wire is not provided along a full length of the second signal wire and the third signal wire between the third signal wire and the second signal wire, wherein the first shield wire and second shield wire extend in an entirely single direction.

2. The electrical device according to claim 1, wherein the signal wires extend along a substantially straight signal wire extension direction.

3. The electrical device according to claim 2, wherein the shield wires extend along the substantially straight signal wire extension direction.

4. An electrical device for transporting electrical signals, wherein the electrical device comprises:
a plurality of signal wires each configured for transporting electrical signals; and
a plurality of staggered shield wires being staggered with respect to each other and each being configured for shielding the signal wires with respect to each other;
wherein each shield wire is arranged between a respective pair of signal wires and extends only along a subsection of each signal wire of the respective pair, wherein the signal wires are arranged in a stair configuration comprising a first signal wire, a second signal wire and a third signal wire, and wherein a first shield wire of the shield wires is disposed in a first respective gap in the stair configuration between the first signal wire and the second signal wire, wherein a second shield wire of the shield wires is disposed in a second respective gap in the stair configuration between the third signal wire and the second signal wire, wherein the first signal wire is adjacent the second signal wire outside of the first respective gap and the third signal wire is adjacent the second signal wire outside of the second respective gap, wherein a full length shield wire is not provided between the first signal wire and the second signal wire or between the third signal wire and the second signal wire, wherein the first shield wire and second shield wire extend in a single direction wherein each of the staggered shield wires is free of a spatial overlap with at least one of a group consisting of at least one neighboring shield wire, and any other staggered shield wire along the single direction.

5. The electrical device according to claim 1, wherein the staggered shield wires are arranged so that each pair of neighboring shield wires is displaced relative to each other along a shield wire extension direction and perpendicular to said shield wire extension direction.

6. The electrical device according to claim 1, wherein the staggered shield wires are arranged so that centers of gravity of at least three of the shield wires are positioned on a straight connection line.

7. The electrical device according to claim 6, wherein the straight connection line is inclined with respect to a shield wire extension direction.

8. The electrical device according to claim 1, wherein the staggered shield wires form a stairway pattern.

9. The electrical device according to claim 1, wherein the staggered shield wires comprise a first shield wire group being aligned along a shield wire extension direction and comprise a second shield wire group being aligned along the shield wire extension direction, and wherein the shield wires of the first shield wire group are displaced with respect to the shield wires of the second shield wire group along the shield wire extension direction and perpendicular to said shield wire extension direction.

10. The electrical device according to claim 9, wherein the shield wires of the first shield wire group and the shield wires of the second shield wire group are arranged such that the shield wires of the first shield wire group are displaced with respect to the shield wires of the second shield wire group along the shield wire extension direction and perpendicular to said shield wire extension direction.

11. The electrical device according to claim 1, wherein at least one of the signal wires extends through a gap between neighboring ones of the staggered shield wires.

12. The electrical device according to claim 11, wherein said at least one of the signal wires comprises two straight sections connected by an angled section extending through the gap.

13. The electrical device according to claim 12, wherein said straight sections extend parallel to said neighboring ones of the staggered shield wires.

14. The electrical device according to claim 12, wherein said angled section is inclined or is perpendicular with respect to said two straight sections.

15. The electrical device according to claim 1, wherein each shield wire is arranged such that a line through midpoints of each shield wire extends through only one of the signal wires between ends of the shield wires.

16. The electrical device according to claim 1, wherein a ratio between a length of a respective one of the shield wires and a length of a respective one of the signal wires neighboring to said respective one of the shield wires is in a range from 0.2 to 0.5.

17. The electrical device according to claim 1, wherein, for at least some of the signal wires, one of said shield wires is located on one side and another one of said shield wires is located longitudinally displaced with respect to said one of said shield wires on an opposing other side of the respective signal wire so that each of said shield wires shields said signal wire with respect to neighboring signal wires along a respective one of different subsections of said signal wire.

18. The electrical device according to claim 1, wherein the shield wires and the signal wires are coplanar.

19. The electrical device according to claim 1, wherein the shield wires and the signal wires are arranged in at least two vertically displaced planes.

20. The electrical device according to claim 1, wherein the shield wires and the signal wires are arranged so that an effective shielding strength of the shield wires is substantially identical.

21. The electrical device according to claim 1, wherein the shield wires are configured for shielding the signal wires for suppressing at least one of capacitive crosstalk and inductive crosstalk.

22. The electrical device according to claim 1, wherein neighboring pairs of the signal wires are configured for transmitting electrical signals with parallel or mutually inverse propagation directions.

23. The electrical device according to claim 1, wherein the shield wires are grounded.

24. The electrical device according to claim 1, configured as routing device for routing the electrical signals.

25. The electrical device according to claim 1, configured for transmitting digital electrical signals.

26. The electrical device according to claim 1, wherein the signal wires and the shield wires form part of an interposer.

27. The electrical device according to claim 1, wherein the signal wires and the shield wires are arranged in a repeating pattern.

28. The electrical device according to claim 1, configured as parallel bus.

29. A method of manufacturing an electrical device for transporting electrical signals, wherein the method comprises:
configuring a plurality of signal wires for transporting electrical signals;
staggering a plurality of shield wires with respect to each other for shielding the signal wires with respect to each other; and arranging each shield wire between a respective pair of signal wires so that each shield wire extends only along a subsection of each signal wire of the respective pair, wherein the signal wires are arranged in a stair configuration comprising a first signal wire, a second signal wire and a third signal wire, and wherein a first shield wire of the shield wires is disposed in a first respective gap in the stair configuration between the first signal wire and the second signal wire, wherein a second shield wire of the shield wires is disposed in a second respective gap in the stair configuration between the third signal wire and the second signal wire, wherein the first signal wire is adjacent the second signal wire outside of the first respective gap and the third signal wire is adjacent the second signal wire outside of the second respective gap, wherein a full length shield wire is not provided between the first signal wire and the third signal wire, wherein the first shield wire and second shield wire do not overlap across a line in a direction 90 degrees from propagation of the first shield wire.

30. An electrical device, comprising:

an IC die; and an interposer coupled to the IC die using solder connections, wherein the solder connections are coupled to plurality of signal paths on the interposer configured for transporting electrical signals, wherein the interposer comprises a plurality of shield paths being staggered with respect to each other and each being configured for shielding at least one of the signal paths;

wherein each shield path is arranged between a respective pair of signal paths and extends only along a subsection of each signal path of the respective pair, wherein the signal paths are arranged in a stair configuration comprising a first signal path, a second signal path and a third signal path, and wherein a first shield path of the shield paths is disposed in a first respective gap in the stair configuration between the first signal path and the second signal path, wherein a second shield path of the shield paths is disposed in a second respective gap in the stair configuration between the third signal path and the second signal path, wherein the first signal path is adjacent the second signal path outside of the first respective gap and the third signal path is adjacent the second signal path outside of the second respective gap, wherein a full length shield path is not provided between the first signal path and the second signal path or between the third signal path and the second signal path, wherein the first shield path and second shield path extend in an entirely single direction.

* * * * *